United States Patent [19]

Ouchi et al.

[11] 3,956,150
[45] May 11, 1976

[54] METHOD OF PREPARING FERROELECTRIC CERAMICS

[75] Inventors: Hiromu Ouchi, Toyonaka; Masamitsu Nishida, Osaka; Kazunori Numata, Moriguchi, all of Japan

[73] Assignee: Matsushita Electric Industrial Co., Ltd., Japan

[22] Filed: Nov. 18, 1974

[21] Appl. No.: 524,940

[30] Foreign Application Priority Data
Nov. 24, 1973  Japan............................ 48-132360

[52] U.S. Cl. .............................................. 252/62.9
[51] Int. Cl.² ................... C04B 35/46; C04B 35/48
[58] Field of Search ................................ 252/62.9

[56] References Cited
UNITED STATES PATENTS

| | | | |
|---|---|---|---|
| 3,518,199 | 6/1970 | Tsubouchi et al. | 252/62.9 |
| 3,528,918 | 9/1970 | Nishida et al. | 252/62.9 |
| 3,595,795 | 7/1971 | Tsubouchi et al. | 252/62.9 |
| 3,669,887 | 6/1972 | Nishida et al. | 252/62.9 |

*Primary Examiner*—Jack Cooper
*Attorney, Agent, or Firm*—Wenderoth, Lind & Ponack

[57] ABSTRACT

A process for preparing strengthened ferroelectric ceramics, which comprises heat treatment of sintered ceramics after sintering of ceramic materials at a temperature range from about 100° to about 400°C. lower than the final sintering temperature of ceramics, holding it for about 1 to about 60 hrs, and then cooling it at a cooling rate from about 300° to about 10°C. per hour. Strengthened ferroelectric ceramics are obtained among the following ferroelectric ceramic compositions:

I. $Pb([B_1]_A Nb_{1-A})O_3\text{-}PbTiO_3\text{-}PbZrO_3$, where $[B_1]$ is Mg, Zn, Cd, Sn, Mn, Fe, Co and Ni when $A=1/3$ and $[B_1]$ is Li and Cu when $A=1/4$, II. $Pb([B_2]_B Nb_{1-B})O_3\text{-}Pb([B_3]_C Nb_{1-C})O_3\text{-}PbTiO_3\text{-}PbZrO_3$, where $[B_2]$ and $[B_3]$, $[B_2] \neq [B_3]$, are Mg, Zn, Cd, Sn, Mn, Fe, Co and Ni when $C=1/3$, and $[B_2]$ and $[B_3]$, $[B_2] \neq [B_3]$, are Li and Cu when B and $C=1/4$, III. $Pb([B_1]_A Nb_{1-A})O_3\text{-}PbTiO_3\text{-}PbZrO_3$ with $MnO_2$ where $[B_1]$ is Mg, Zn, Cd, Sn, Fe, Co and Ni when $A=1/3$, and $[B_1]$ is Li and Cu when $A=1/4$, and IV. $Pb([B_2]_B Nb_{1-B})O_3\text{-}Pb([B_3]_C Nb_{1-C})O_3\text{-}PbTiO_3\text{-}PbZrO_3$ with $MnO_2$, where $[B_2]$ and $[B_3]$, $[B_2] \neq [B_3]$, are Mg, Zn, Cd, Sn, Fe, Co and Ni when B and $C=1/3$, and $[B_2]$ and $[B_3]$, $B_2 \neq B_3$, are Li and Cu when B and $C=1/4$.

6 Claims, No Drawings

METHOD OF PREPARING FERROELECTRIC CERAMICS

This invention relates to a method of preparing ferroelectric ceramics, especially strengthened ferroelectric ceramic bodies, and more particularly relates to a method of mechanically strengthening ferroelectric ceramics by heat treatment after the final sintering of the ceramics.

Ferroelectric ceramics of barium titanate and lead titanate zirconate are commonly used in a wide range of application. The use of piezo-electric materials in various transducer applications in the production, measurement and sensing of sound, shock, vibration, pressure, etc., have increased greatly in recent years. Both crystal and ceramic types of transducers have been widely used. But because of their potentially lower cost and facility in the fabrication of ceramics with various shapes and sizes and their greater durability for high temperature and/or for humidity than that of crystalline substances, piezoelectric ceramic materials have recently become important in various transducer applications.

These ferroelectric ceramics are commonly made from the sintering of ferroelectric ceramic compositions. Thereafter sintered ceramics are polarized by applying a D.C. voltage between the electrodes in order to impart thereto electromechanical transducing properties similar to the well known piezoelectric effect.

The characteristics required for piezoelectric ceramics vary with species of application. For example, piezoelectric ceramics for electric wave filter application at relatively low power level require a specified value of coupling coefficient, a high mechanical quality factor and a high stability with respect to aging and temperature. On the other hand, piezoelectric ceramics for electromechanical transducer applications which need high power operation (i.e. capable of withstanding in service high mechanical pressures or electrical driving fields) such as piezoelectric ceramic transformers for high voltage generation and ultrasonic cleaner tranducers, should have a substantially high electromechanical coupling coefficient, a high mechanical quality factor and a high mechanical tensile strength. As is well understood by those skilled in the electromechanical transducer art, one of the prime requisites of a material employed in the fabrication of transducer elements for high power operation is an improvement in the mechanical tensile strength. The improvement of mechanical strength has been developed to a considerable extent in lead zirconate titanate ceramic material by the addition of small quantities of oxide. However, it is difficult for lead zirconate titanate ceramic material to get the mechanically strengthened ceramics provided with active electromechanical transducing properties. The lead zirconate titanate ceramics are liable to be broken down even when the ceramic element is driven under the high power operation within the region of linear piezoelelctric properties. Therefore, it is important to increase the mechanical tensile strength of the ceramic material for obtaining a stable high power operation in electromechanical transducer application.

This invention contemplates a method of preparing mechanically strengthened ferroelectric ceramics which are particularly suited and adapted for use in piezoelectric ceramic transformers, ultrasonic cleaners or other applications requiring the same combination of properties.

It is the fundamental object of this invention to provide a method of preparing mechanically strengthened ferroelectric ceramics which overcome the problems of the prior art as outlined above.

Another object of this invention is to provide ferroelectric ceramics particularly adapted for use in piezoelectric ceramic transformers or other applications requiring high mechanical tensile strength and high power operation.

These objects of this invention and the manners of their attainment will be readily apparent to those conversant with the art from reading of the following description and subjoined claims.

The present invention provides a method of preparing mechanically strengthened ferroelectric ceramics which essentially comprise a complex compound, lead titanate and lead zirconate as principal constituents and without and with manganese dioxide as an additive.

Ferroelectric ceramics prepared by heat treatment according to this invention have excellent properties in which mechanical tensile strength is increased to 70 to 8 % stronger and resonant impedance is decreased to 24 to 13% smaller than the ceramics without heat treatment.

This invention is based on the discovery that within particular condition of heat treatment of the sintered ceramic materials as hereinafter described with particularity, the complex compound combined with lead titanate and lead zirconate ceramic materials exhibits a unique combination of properties, particularly improved mechanical tensile strength, adapting them for use as electromechanical transducers for high power operation such as piezoelectric ceramic transformers and so on. The strengthened ferroelectric ceramics prepared by heat treatment according to this invention include the following materials:

I. $Pb([B_1]_A Nb_{1-A})O_3$-$PbTiO_3$-$PbZrO_3$, where $[B_1]$ is Mg, Zn, Cd, Sn, Mn, Fe, Co and Ni when $A=⅓$ and $[B_1]$ is Li and Cu when $A=¼$, II. $Pb([B_2]_B Nb_{1-B})O_3$-$Pb([B_3]_C Nb_{1-C})O_3$-$PbTiO_3$-$PbZrO_3$, where $[B_2]$ and $[B_3]$ are Mg, Zn, Cd, Sn, Mn, Fe, Co and Ni when B and $C=⅓$, $[B_2] \neq [B_3]$, and $[B_2]$ and $[B_3]$ are Li and Cu when B and $C=¼$, $[B_2] \neq [B_3]$, III. $Pb([B_1]_A Nb_{1-A})O_3$-$PbTiO_3$-$PbZrO_3$ with $MnO_2$, where $[B_1]$ is Mg, Zn, Cd, Sn, Fe, Co and Ni when $A=⅓$ and $[B_1]$ is Li and Cu when $A=¼$, and IV $Pb([B_2]_B Nb_{1-B})O_3$-$Pb([B_3]_C Nb_{1-C})O_3$-$PbTiO_3$-$PbZrO_3$ with $MnO_2$, where $[B_2]$ and $[B_3]$ are Mg, Zn, Cd, Sn, Fe, Co and Ni when B and $C=⅓$, $[B_2] \neq [B_3]$, and $[B_2]$ and $[B_3]$ are Li and Cu when B and $C=¼$, $[B_2] \neq [B_3]$.

In ordinary prior techniques, these ferroelectric ceramics are made from the following typical process comprising (1) intimately wet-mixing the constituent powder raw materials after the desired constituent powders are weighed. These materials are often in the form of oxide, hydroxide, or carbonates, and the proper amounts of all constituents are computed from their atom formulas preferably using reagent grade, or better, material; (2) drying said mixture; (3) calcining said mixture at temperature from 700°C. to 900°C. for from 0.5 to 3 hours (generally 2 hours for crucible calcined materials) to produce a solid solution; (4) wetgrinding said calcined material and drying it to prepare a homogeneous fine particle material; (5) mixing it with binder solution such as polyvinyl alcohol solution and granulating; (6) forming said mixtures into a predetermined shape by pressing with pressures of 700 kg/cm$^2$; (7) loading it into an alumina sagger; and (8) firing said shaped mixture at temperature from about 1200° to about 1300°C. for about 1 hour to obtain the sintered ferroelectric ceramics. One of the features of the method of this invention is in that the thus obtained sintered ceramics are re-heated for 1 to 60 hours at a temperature lower by 100° to 400°C. than the firing (sintering) temperature, and are then cooled by a cooling rate of 300° to 10°C. per hour. Thereby, ferroelectric ceramics having a mechanically high tensile strength and a low impedance in the resonance state thereof are produced.

This invention will be understood more readily with reference to the following Examples I to IV, but these Examples are intended to illustrate the invention only and not to be construed to limit the scope of the invention.

EXAMPLE I

In this Example, ceramics expressible by $xPb(Ni_{1/3}Nb_{2/3})O_3$-$yPbTiO_3$-$zPbZrO_3$ ($x>o$, $y>o$, $z>o$, $x+y+z=1$) were selected to be subjected to the novel method. By weighing commercially available PbO, NiO, Nb$_2$O$_5$, TiO$_2$ and ZrO$_2$ of high pure grade, a mixture thereof in which $x=0.37$ and $y=0.36$ according to the above expression was prepared. The mixture was wet-milled in a ball mill for 17 hours, and was then dried. It was then compressed into a compressed body and calcined at 850°C for 2 hours. The thus calcined material was ground and mixed with polyvinylalcohol as a binder solution. This mixture was granulated, and then compressed to have a form of an I-shaped plate at a pressure of 700 Kg/g$^2$. This I-shaped plate was fired at 1280°C for 45 minutes. The thus fired plate (ceramic) had a tensile strength of 153 kg/cm$^2$ (cross-section of specimen: about 7×3 mm). The thus obtained ceramic plate was heated for 1 to 60 hours at a temperature lower by 100° to 400°C. than the firing temperature, and was then cooled by a cooling rate of 50°C. per hour. The ceramics obtained in this manner had tensile strengths as shown in Table 1. Each value of Table 1 is an average value obtained by averaging the tensile strengths of five specimens made in the same manner.

Table 1

| Heating Temp. (°C) | Heating Condition and Tensile Strength (Kg/cm$^2$) Heating Time (hour) | | | |
|---|---|---|---|---|
| | 1 | 20 | 60 | 80 |
| 800 | — | 152 | 148 | — |
| 880 | 167 | 193 | 185 | 151 |
| 1000 | 208 | 230 | 226 | — |
| 1100 | 225 | 263 | 238 | — |
| 1180 | 168 | 175 | 170 | 145 |
| 1230 | 150 | — | 147 | — |

To examine the influence of the cooling rate, specimens were made in a manner the same as that described above, except that the cooling rate was changed. Table 2 shows the result thereof, in which each value therein is an average value obtained by averaging the tensile strengths of five specimens made in the same manner.

Table 2

| Cooling Rate (°C/hr) | Heating Condition, Cooling Rate and Tensile Strength (kg/cm$^2$) Heating Condition | | |
|---|---|---|---|
| | 880°C. 60 hours | 1000°C. 20 hours | 1180°C. 1 hour |
| 300 | 171 | 194 | 165 |
| 50 | 185 | 230 | 168 |
| 10 | 182 | 226 | 170 |

EXAMPLE II

In this Example, ceramics expressible by $wPb(Mg_{1/3}Nb_{2/3})O_3$-$xPb(Mn_{1/3}Nb_{2/3})O_3$-$yPbTiO_3$-$zPbZrO_3$ ($w>o$, $x>o$, $y>o$, $z>o$, $w+x+y+z=1$) were selected to be subjected to the novel method. By weighing commercially available PbO, MgO, Nb$_2$O$_5$MnO$_2$, TiO$_2$ and ZrO$_2$ of high pure grade, a mixture thereof in which $w=x=0.06$ and $y=0.44$ according to the above expression was prepared. The mixture was wet-milled in a ball mill for 17 hours, and was then dried. It was then compressed into a compressed body and calcined at 850°C for 2 hours. The thus calcined material was ground and mixed with polyvinyl alcohol as a binder solution. This mixture was granulated, and then compressed to have a form of an I-shaped plate at a pressure of 700 kg/cm$^2$. This I-shaped plate was fired at 1280°C. for 45 minutes. The thus fired plate (ceramic) had a tensile strength of 285 kg/cm$^2$. The thus obtained ceramic plate was heated for 1 to 60 hours at a temperature lower by 100° to 400°C. than the firing temperature, and was then cooled by a cooling rate of 50°C. per hour. The ceramics obtained in this manner had tensile strengths as shown in Table 3. Each value of Table 3 is an average value obtained by averaging the tensile strengths of five specimens made in the same manner.

Table 3

| Heating Temp. (°C) | Heating Condition and Tensile Strength (kg/cm$^2$) Heating time (hour) | | | |
|---|---|---|---|---|
| | 1 | 20 | 60 | 80 |
| 800 | — | 280 | 272 | — |
| 880 | 316 | 327 | 318 | 276 |
| 1000 | 332 | 378 | 340 | — |
| 1100 | 368 | 428 | 355 | — |
| 1180 | 323 | 330 | 308 | 269 |
| 1230 | 278 | — | 264 | — |

To examine the influence of the cooling rate, specimens were made in a manner the same as that described above, except that the cooling rate was changed. Table 4 shows the result thereof, in which each value therein is an average value obtained by averaging the tensile strengths of five specimens made in the same manner.

Table 4

| Cooling Rate (°C/hr) | Heating Condition, Cooling Rate and Tensile Strength (kg/cm$^2$) Heating Condition | | |
|---|---|---|---|
| | 880°C. 60 hours | 1000°C. 20 hours | 1180°C. 1 hour |
| 300 | 309 | 342 | 310 |
| 50 | 318 | 378 | 323 |
| 10 | 314 | 363 | 312 |

EXAMPLE III

In this Example, ceramics expressible by $xPb(Li_{1/4}Nb_{3/4})O_3$-$yPbTiO_3$-$zPbZrO_3$+m wt. % $MnO_2$ ($x>0$, $y>0$, $z>0$, $m>0$, $x+Y+z=1$) were selected to be subjected to the novel method. By weighing commercially available PbO, $Li_2CO_3$, $Nb_2O_5$, $TiO_2$, $ZrO_2$ and $MnO_2$ of high pure grade, a mixture thereof in which $x=0.1$, $y=0.43$ and $m=0.8$ according to the above expression was prepared. The mixture was wet-milled in a ball mill for 17 hours, and was then dried. It was then compressed into a compressed body and calcined at 850°C for 2 hours. The thus calcined material was ground and mixed with polyvinyl alcohol as a binder solution. This mixture was granulated, and then compressed to have a form of an I-shaped plate at a pressure of 700 kg/cm². This I-shaped plate was fired at 1250°C for 45 minutes. The thus fired plate (ceramic) had a tensile strength of 280 kg/cm². The thus obtained ceramic plate was heated for 1 to 60 hours at a temperature lower by 100° to 400°C. than the firing temperature, and was then cooled by a cooling rate of 50°C. per hour. The ceramics obtained in this manner had tensile strengths as shown in Table 5. Each value of Table 5 is an average value obtained by averaging the tensile strengths of five specimens made in the same manner. In the method of this invention, the heat treatment can exhibit its advantage even if it is carried out without a time break after the firing (sintering) step. The * marks in Table 5 represent that the heat treatment were carried out without a time break after the firing step.

Table 5

| Heating Temp. (°C) | Heating Condition and Tensile strength (kg/cm²) | | | |
|---|---|---|---|---|
| | Heating time (hour) | | | |
| | 1 | 20 | 60 | 80 |
| 750 | — | 278 | 269 | — |
| 850 | 313 | 325 | 320 | 275 |
| 1000 | 330* | 375* | 345* | — |
| 1150 | 322 | 334 | 303 | 263 |
| 1200 | 272 | — | 260 | — |

To examine the influence of the cooling rate, specimens were made in a manner the same as that described above, except that the cooling rate was changed. Table 6 shows the result thereof, in which each value therein is an average value obtained by averaging the tensile strengths of five specimens made in the same manner. Further, the methods represented by the value with * marks in Table 6 correspond to the methods represented by the values with * marks in Table 5, respectively.

Table 6

| Cooling Rate (°C/hr) | Heating Condition, Cooling Rate and Tensile Strength (kg/cm²) | | |
|---|---|---|---|
| | Heating Condition | | |
| | 850°C 60 hours | 1000°C 20 hours | 1150°C 1 hour |
| 300 | 304 | 338* | 306 |
| 50 | 320 | 375* | 322 |
| 10 | 312 | 354* | 309 |

EXAMPLE IV

In this Example, ceramics expressible by $wPb(Zn_{1/3}Nb_{2/3})O_3$-$xPb(Sn_{1/3}Nb_{2/3})O_3$-$yPbTiO_3$-$zPbZrO_3$+m wt. % $MnO_2$ ($w>0$, $x>0$, $y>0$, $z>0$, $m>0$, $w+x+y+z=1$) were selected to be subjected to the novel method. By weighing commercially available PbO, ZnO, $Nb_2O_5$, $SnO_2$, $TiO_2$, $ZrO_2$ and $MnO_2$ of high pure grade, a mixture thereof in which $w=x=0.05$, $y=0.44$ and $m=1.0$ according to the above expression was prepared. The mixture was wet-milled in a ball mill for 17 hours, and was then dried. It was then compressed into a compressed body and calcined at 850°C for 2 hours. The thus calcined material was ground and mixed with polyvinyl alcohol as a binder solution. This mixture was granulated, and then compressed to have a form of an I-shaped plate at a pressure of 700 kg/cm². This I-shaped plate was fired at 1280°C for 45 minutes. The thus fired plate (ceramic) had a tensile strength of 255 kg/cm². The thus obtained ceramic plate was heated for 1 to 60 hours at a temperature lower by 100° to 400°C. than the firing temperature, and was then cooled by a cooling rate of 50°C per hour. The ceramics obtained in this manner had tensile strengths as shown in Table 7. Each value of Table 7 is an average strength of five specimens made in the same manner.

Table 7

| Heating Temp. (°C) | Heating Condition and Tensile Strength (kg/cm²) | | | |
|---|---|---|---|---|
| | Heating time (hour) | | | |
| | 1 | 20 | 60 | 80 |
| 800 | — | 257 | 252 | — |
| 880 | 324 | 332 | 320 | 254 |
| 1000 | 335 | 376 | 347 | — |
| 1100 | 375 | 438 | 364 | — |
| 1180 | 328 | 336 | 312 | 250 |
| 1230 | 253 | — | 248 | — |

To examine the influence of the cooling rate, specimens were made in a manner the same as that described above, except that the cooling rate was changed. Table 8 shows the result thereof, in which each value therein is an average value obtained by averaging the tensile strengths of five specimens made in the same manner.

Table 8

| Cooling Rate (°C/hr) | Heating Condition, Cooling Rate and Tensile Strength (Kg/cm²) | | |
|---|---|---|---|
| | Heating Condition | | |
| | 880°C 60 hours | 1000°C 20 hours | 1180°C 1 hour |
| 300 | 312 | 350 | 316 |
| 50 | 320 | 376 | 328 |
| 10 | 325 | 371 | 322 |

As apparent from these Examples I to IV, the mechanical tensile strength of ferroelectric ceramics which have been subjected to sintering (firing) step can be remarkably increased (by 70 to 8 % in comparison with those not subjected to the heat and cooling treatment in the method of this invention) by heating the ceramics for about 1 to about 60 hours at a temperature lower by about 100° to 400°C than the optimum sintering temperature, and cooling the thus heated ceramics with a cooling rate of about 300° to about 10°C./hr. The tensile strengths of the ferroelectric ceramics falling within the patent claims in this patent application but falling outside the range of Examples I to IV also showed improvements comparable to the values shown in the Tables therein, when they were subjected to the heat and cooling treatment in the method of this invention. Further, the ferroelectric ceramics, when subjected to the heat and cooling treatment in the method of this invention, showed a decrease of their impedance by about 24 to 13 % under resonance state in comparison with those not subjected to the heat and cooling treatment in the method of this invention. Besides, it should be noted, as apparent e.g. from Example III, that the heat and cooling treatment in the method of this invention can also exhibit advantage when it is carried out without a time break after the sintering step (for making the primary ceramics) which is a final step of the conventional method, not only when it is carried out for the ceramics having been sintered and then cooled to room temperature.

What is claimed is:

1. A method of preparing ferroelectric ceramics selected from the group consisting of:

I   Pb $([B_1]_A Nb_{1-A})O_3$-$PbTiO_3$-$PbZrO_3$, where $[B_1]$ is one member selected from the group consisting of Mg, Zn, Cd, Sn, Mn, Fe, Co and Ni when $A=\frac{1}{3}$, and $[B_1]$ is one member selected from the group consisting of Li and Cu when $A=\frac{1}{4}$, II.  Pb $([B_2]_B Nb_{1-B})O_3$-$Pb([B_3]_C Nb_{1-C})O_3$-$PbTiO_3$-$PbZrO_3$, where each of $[B_2]$ and $[B_3]$, $[B_2] \ne [B_3]$, is one member selected from the group consisting of Mg, Zn, Cd, Sn, Mn, Fe, Co and Ni when B and $C=\frac{1}{3}$, and each of $[B_2]$ and $[B_3]$, $[B_2] \ne [B_3]$, is one member selected from the group consisting of Li and Cu when B and $C=\frac{1}{4}$, III. Pb $([B_1]_A Nb_{1-A})O_3$-$PbTiO_3$-$PbZrO_3$ with $MnO_2$, where $[B_1]$ is one member selected from the group consisting of Mg, Zn, Cd, Sn, Fe, Co and Ni when $A=\frac{1}{3}$, and $[B_1]$ is one member selected from the group consisting of Li and Cu when $A=\frac{1}{4}$, and IV.  $Pb([B_2]_B Nb_{1-B})O_3$-$Pb([B_3]_C Nb_{1-C})O_3$-$PbTiO_3$-$PbZrO_3$ with $MnO_2$, where each of $[B_2]$ and $[B_3]$, $[B_2 \ne B_3]$, is one member selected from the group consisting of Mg, Zn, Cd, Sn, Fe, Co and Ni when B and $C=\frac{1}{3}$, and each of $[B_2]$ and $[B_3]$, $[B_2] \ne [B_2]$, is one member selected from the group consisting of Li and Cu when B and $C=\frac{1}{4}$, said method comprising: calcining at 700° to 900°C a powdered mixture of the oxides, hydroxides or carbonates of the metals to be contained in the ceramics to form a solid solution and then sintering at 1200° to 1300°C, then heat treating at a temperature lower by about 100°C to about 400°C than the sintering temperature, maintaining said heat treating for from about 1 hour to about 60 hours, and then cooling the material subjected to said heat treatment at a cooling rate from about 300°C per hour to about 10°C per hour, so as to increase the tensile strength and decrease the resonant impedance of said ceramics.

2. A method of preparing ferroelectric ceramics comprising the material system $Pb(Ni_{1/3}Nb_{2/3})O_3$-$PbTiO_3$-$PbZrO_3$ in solid solution, said method comprising: calcining at 700° to 900°C a powdered mixture of the oxides, hydroxides or carbonates of the metals to be contained in the ceramics, to form a solid solution and then sintering at 1200° to 1300°C, then heat treating at a temperature lower by about 100° to about 400°C than the sintering temperature, maintaining said heat treatment for from about 1 hour to about 60 hours, and cooling the material subjected to said heat treatment at a cooling rate from about 300° per hour to about 10°C per hour, so as to increase the tensile strength and decrease the resonant impedance of said ceramics.

3. A method of preparing ferroelectric ceramics comprising the material system $Pb(Mg_{1/3}Nb_{2/3})O_3$-$Pb(Mn_{1/3}Nb_{2/3})O_3$-$PbTiO_3$-$PbZrO_3$ in solid solution, said method comprising: calcining at 700° to 900°C a powdered mixture of the oxides, hydroxides or carbonates of the metals to be contained in the ceramics, to form a solid solution and then sintering at 1200° to 1300°C, then heat treating at a temperature lower by about 100° to about 400°C than the sintering temperature, maintaining said heat treatment for from about 1 hour to about 60 hours, and cooling the material subjected to said heat treatment at a cooling rate from about 300°C per hour to about 10°C per hour so as to increase the tensile strength and decrease the resonant impedance of said ceramics.

4. A method of preparing ferroelectric ceramics comprising the material system $Pb(Li_{1/4}Nb_{3/4})O_3$-$PbTiO_3$-$PbZrO_3$ plus $MnO_2$ in solid solution, said method comprising: calcining at 700° to 900°C a powdered mixture of the oxides, hydroxides or carbonates of the metals to be contained in the ceramics, to form a solid solution and then sintering at 1200° to 1300°C, then heat treating at a temperature lower by about 100° to about 400°C than the sintering temperature, maintaining said heat treatment for from about 1 hour to about 60 hours, and cooling the material subjected to said heat treatment at a cooling rate from about 300° per hour to about 10°C per hour, so as to increase the tensile strength and decrease the resonant impedance of said ceramics.

5. A method of preparing ferroelectric ceramics comprising the material system $Pb(Zn_{1/3}Nb_{2/3})O_3$-$Pb(Sn_{1/3}Nb_{2/3})O_3$-$PbTiO_3$-$PbZrO_3$ plus $MnO_2$ in solid solution, said method comprising: calcining at 700° to 900°C a powdered mixture of the oxides, hydroxides or carbonates of the metals to be contained in the ceramics to form a solid solution and then sintering at 1200° to 1300°C, then heat treating at a temperature lower by about 100°C to about 400°C than the sintering temperature, maintaining said heat treatment for from about 1 hour to about 60 hours, and then cooling said material subjected to said heat treatment at a cooling rate from about 300°C per hour to about 10°C per hour, so as to increase the tensile strength and decrease the resonant impedance of said ceramics.

6. A method of preparing ferroelectric ceramics comprising one material selected from the group consisting of
   $Pb(Ni_{1/3}Nb_{2/3})_{0.37}Ti_{0.36}Zr_{0.27}O_3$,
   $Pb(Mg_{1/3}Nb_{2/3})_{0.06}(Mn_{1/3}Nb_{2/3})_{0.06}Ti_{0.44}Zr_{0.44}O_3$,
   $Pb(Li_{1/4}Nb_{3/4})_{0.1}Ti_{0.43}Zr_{0.47}O_3 + 0.8$ wt% $MnO_2$,
   $Pb(Zn_{1/3}Nb_{2/3})_{0.05}(Sn_{1/3}Nb_{2/3})_{0.05}Ti_{0.44}Zr_{0.46}O_3 + 1$ wt% $MnO_2$, said method comprising:
   calcining at 700° to 900°C a powder mixture of the oxides, hydroxides or carbonates of the metals to be contained in the ceramics to form a solid solution and then sintering at 1200° to 1300°C, then heat treating at a temperature lower by about 100° to about 400°C than the sintering temperature of said ceramics, maintaining said heat treatment for from about 1 hour to about 60 hours, and then cooling said material subjected to said heat treatment at a cooling rate from about 300°C per hour to about 10°C per hour, so as to increase the tensile strength and decrease the resonant impedance of said ceramics.

* * * * *